(12) United States Patent
Zhang

(10) Patent No.: US 12,389,763 B2
(45) Date of Patent: Aug. 12, 2025

(54) DISPLAY PANEL AND DISPLAY DEVICE

(71) Applicant: Xiamen Tianma Micro-Electronics Co., Ltd., Xiamen (CN)

(72) Inventor: Peng Zhang, Shanghai (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 118 days.

(21) Appl. No.: 17/221,269

(22) Filed: Apr. 2, 2021

(65) Prior Publication Data

US 2021/0226167 A1    Jul. 22, 2021

(30) Foreign Application Priority Data

Dec. 21, 2020   (CN) .......................... 202011520255.2

(51) Int. Cl.
*H10K 59/131*   (2023.01)
*H10K 50/844*   (2023.01)
*H10K 59/122*   (2023.01)
*H10K 59/80*    (2023.01)

(52) U.S. Cl.
CPC ......... *H10K 59/131* (2023.02); *H10K 50/844* (2023.02); *H10K 59/122* (2023.02); *H10K 59/873* (2023.02)

(58) Field of Classification Search
CPC ............. H01L 51/5253; H01L 27/3276; H01L 27/3246; H10K 59/122; H10K 59/844; H10K 59/131
See application file for complete search history.

(56) References Cited

U.S. PATENT DOCUMENTS

| | | | |
|---|---|---|---|
| 2019/0006442 A1* | 1/2019 | Byun | H10K 59/131 |
| 2021/0134928 A1* | 5/2021 | Bang | H10K 59/131 |

* cited by examiner

*Primary Examiner* — Vongsavanh Sengdara
(74) *Attorney, Agent, or Firm* — von Briesen & Roper, s.c.

(57) ABSTRACT

Provided are a display panel and display device. The display panel includes a first organic forbidden area and a first organic baffle wall disposed around a display area. The display area includes multiple light emitting units arranged in an array, and each light emitting unit includes a first electrode and a second electrode. The display panel further includes a substrate and a first metal layer and a second metal layer located at a side of the substrate, the second metal layer is configured to provide a first power supply for the second electrode through the first metal layer, and the first metal layer covers at least part of the first organic forbidden area and at least part of the first organic baffle wall. The display panel further includes an organic protective layer which covers at least a side wall of an edge of the first metal layer.

10 Claims, 16 Drawing Sheets

US 12,389,763 B2

DISPLAY PANEL AND DISPLAY DEVICE

CROSS-REFERENCE TO RELATED APPLICATION

This application claims priority to Chinese Patent Application No. 202011520255.2 filed Dec. 21, 2020, the disclosure of which is incorporated herein by reference in its entirety.

TECHNICAL FIELD

The present disclosure relates to a display technology field and in particular, to a display panel and a display device.

BACKGROUND

With the continuous renewal of display technologies, narrow bezel design and bezel-less design have become hot topics in recent years. Since the volume of the display screen adopting the narrow bezel design can be compressed maximally and the visual area of the display screen is wider at the same time, the narrow bezel design becomes the development trend and direction of the future display screen.

However, as the bezel of the display screen becomes more and more narrow, the sealing quality of the display screen is often affected, resulting in that the display screen's performance in blocking water vapor is deteriorated and the external water vapor can easily reach the display area through the bezel, thereby leading to poor display and reducing the reliability of the display screen.

SUMMARY

The present disclosure provides a display panel and a display device to improve the problem of water vapor invasion and improve the reliability of the display panel.

In one aspect, embodiments of the present disclosure provide a display panel. The display panel includes: a display area. The display area includes multiple light emitting units arranged in an array, and each of the multiple light emitting units includes a first electrode and a second electrode.

The display area includes multiple light emitting units arranged in an array and the light emitting units include a first electrode and a second electrode.

The display panel further includes a substrate, and a first metal layer and a second metal layer which are located at a side of the substrate. The first metal layer is disposed in a same layer as the first electrode, and the first metal layer is located at a side of the second metal layer facing away from the substrate.

The second electrode is connected to the first metal layer, the first metal layer is connected to the second metal layer. The second metal layer is configured to provide a first power supply for the second electrode through the first metal layer.

The first metal layer covers at least part of the first organic forbidden area and at least part of the first organic baffle wall.

The display panel includes an organic protective layer. The organic protective layer covers at least a side wall of an edge of the first metal layer, and the organic protective layer is connected to the first organic baffle wall.

The edge of the first metal layer includes a first edge segment, and the first edge segment overlaps the first organic forbidden area in a direction perpendicular to the substrate.

A length of the first edge segment is larger than a length of the first organic forbidden area in a first direction. The first direction is a direction in which the display area points to the first organic forbidden area.

In another aspect, embodiments of the present disclosure further provide a display device including the display panel described in the first aspect.

DETAILED DESCRIPTION

Figure 1:
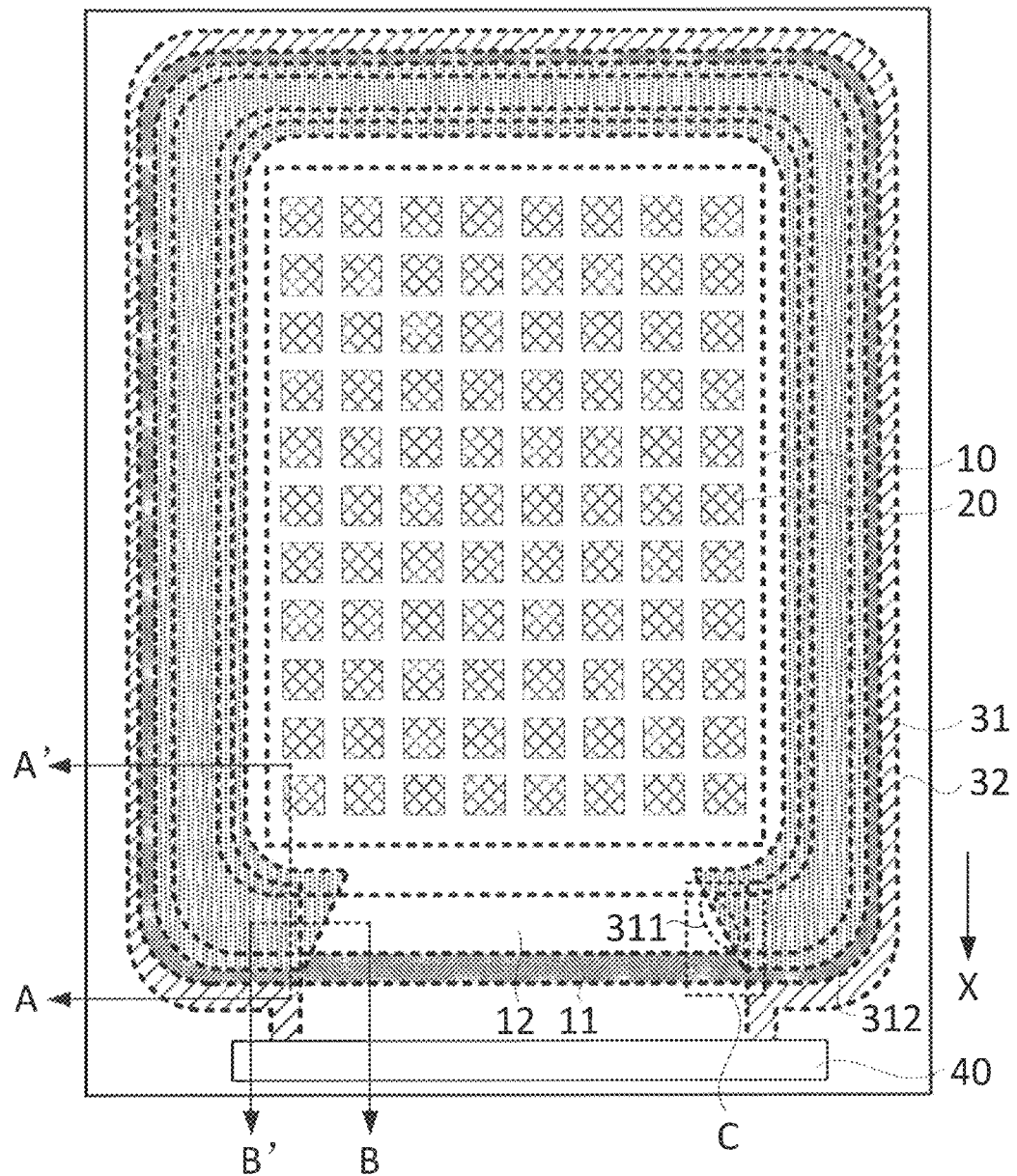
FIG. 1 is a structural view of a display panel provided by an embodiment of the present disclosure.

Hereinafter, the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
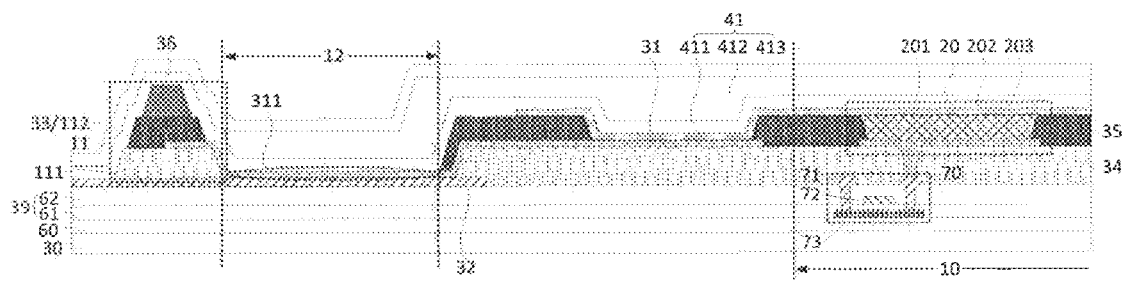
FIG. 2 is a sectional view taken along a line A-A' of FIG. 1.
Figure 3:
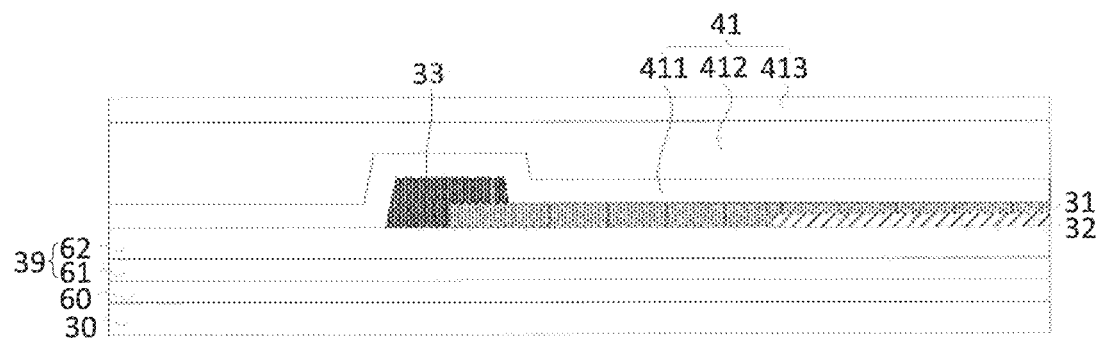
FIG. 3 is a sectional view taken along a line B-B' of FIG. 1.
Figure 4:
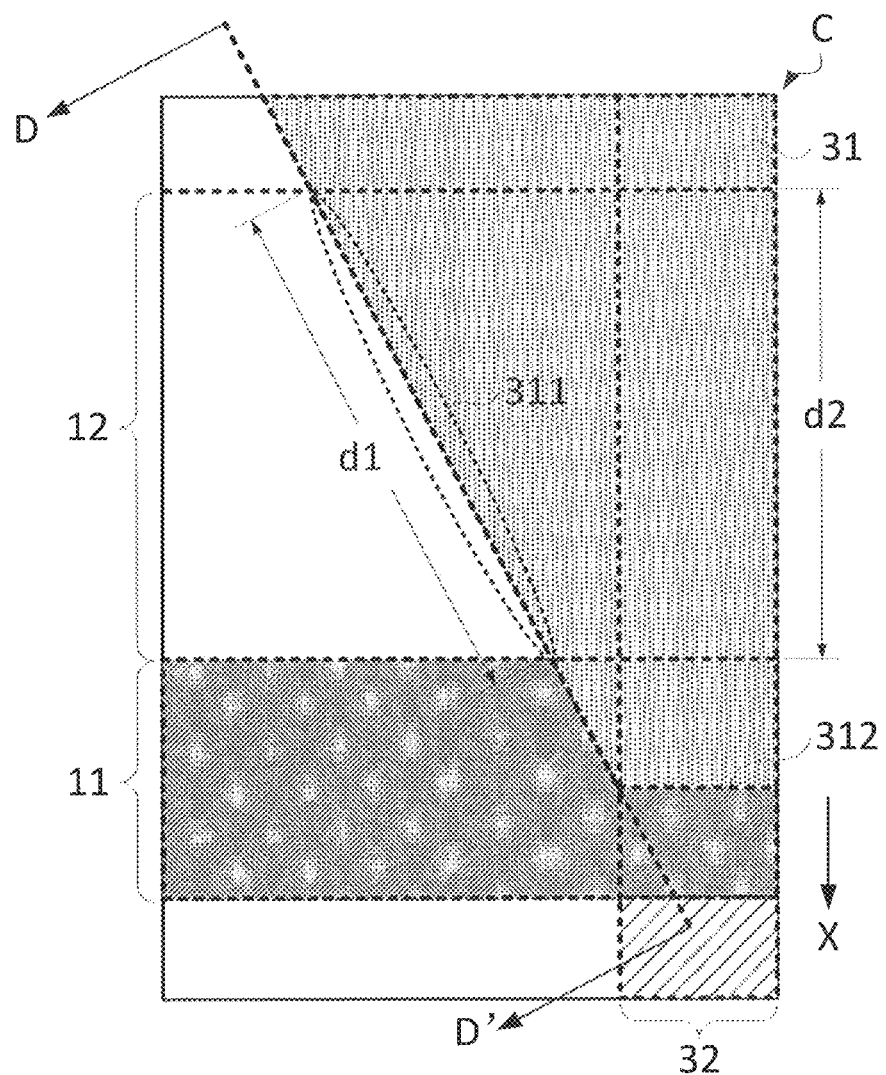
FIG. 4 is an enlarged structural view of an area C of FIG. 1.
Figure 5:
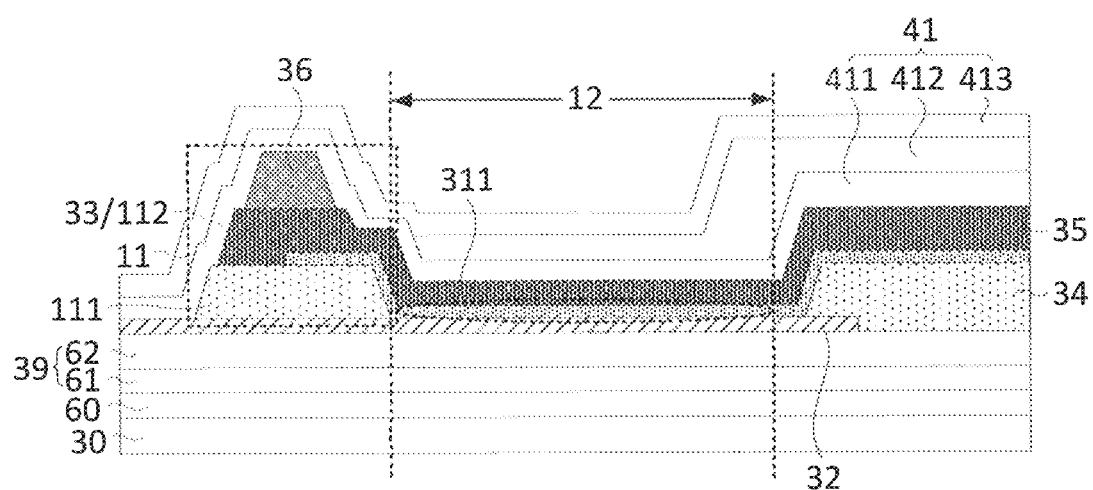
FIG. 5 is a sectional view taken along a line D-D' of FIG. 4.

FIG. 1 is a structural view of a display panel provided by an embodiment of the present disclosure. FIG. 2 is a sectional view taken along a line A-A' of FIG. 1. FIG. 3 is a sectional view taken along a line B-B' of FIG. 1. FIG. 4 is an enlarged structural view of area C of FIG. 1. FIG. 5 is a sectional view taken along a line D-D' of FIG. 4. As shown in FIGS. 1 to 5, the display panel provided by the embodiment of the present disclosure includes a display area 10, and a first organic forbidden area 12 and a first organic baffle wall 11 which are disposed around the display area 10. The display area 10 includes multiple light emitting units 20 arranged in an array, and each light emitting unit 20 includes a first electrode 201 and a second electrode 202. The display panel further includes a substrate 30, and a first metal layer 31 and a second metal layer 32 which are located at a side of the substrate 30. The first metal layer 31 is disposed in a same layer as the first electrode 201, and the first metal layer 31 is located at a side of the second metal layer 32 facing away from the substrate 30. The second electrode 202 is connected to the first metal layer 31, the first metal layer 31 is connected to the second metal layer 32, the second metal layer 32 is configured to provide a first power supply for the second electrode 202 through the first metal layer 31, and the first metal layer 31 covers at least part of the first organic forbidden area 12 and at least part of the first organic baffle wall 11. The display panel further includes an organic protective layer 33. The organic protective layer 33 covers at least a side wall of an edge of the first metal layer 31, and the organic protective layer 33 is connected to the first organic baffle wall 11. The edge of the first metal layer 31 includes a first edge segment 311, and the first edge segment 311 overlaps the first organic forbidden area 12 in a direction perpendicular to the substrate 30. A length of the first edge segment 311 is larger than a length of the first organic forbidden area 12 in a first direction X. The first direction X is a direction in which the display area 10 points to the first organic forbidden area 12.

Specifically, as shown in FIGS. 1 to 5, the display area 10 includes multiple light emitting units 20 arranged in an array; each light emitting unit 20 includes a first electrode 201, a second electrode 202, and a light emitting functional layer 203 between the first electrode 201 and the second electrode 202. The first electrode 201 may be an anode, the second electrode 202 may be a cathode, and the light emitting functional layer 203 may emit light through carrier injection and recombination under the driving of an electric field between the first electrode 201 and the second electrode 202, thereby achieving a display function.

Further referring to FIGS. 1 to 5, the display panel further includes the substrate 30, and the first metal layer 31 and the second metal layer 32 which are located at a side of the substrate 30. The first metal layer 31 is located at the side of the second metal layer 32 facing away from the substrate 30. The second electrode 202 is connected to the first metal layer 31, the first metal layer 31 is connected to the second metal layer 32, so that the second metal layer 32 is configured to provide a first power supply for the second electrode 202 through the first metal layer 31. Compared with the case where the second metal layer 32 is directly electrically connected to the second electrode 202, in this embodiment, drilling a deeper through hole to make the second metal layer 32 be directly connected to the second electrode 202 can be avoided, so that the problem of poor contact between the second metal layer 32 and the second electrode 202 caused by drilling the deeper through hole can be solved, which facilitates improving the reliability of the display panel. The second metal layer 32 may be connected to the drive chip 40, and the first power supply may be a PVEE power supply provided by the drive chip 40. The PVEE power supply passes through the second metal layer 32 and the first metal layer 31 sequentially to reach the second electrode 202, thereby driving the light emitting functional layer 203 to emit light.

In addition, the first metal layer 31 and the first electrode 201 may be disposed in the same layer, thereby reducing a configuration of one metal layer, which facilitates reducing the production cost and the thickness of the display panel. Meanwhile, the first metal layer 31 and the first electrode 201 can be prepared in the same process, thereby shortening the preparation time of the display panel.

Further referring to FIGS. 1 to 5, the display panel further includes a thin film package layer 41 and a first organic baffle wall 11 disposed around the display area 10. The thin film package layer 41 is located on the side of the second electrode 202 facing away from the substrate 30, and may include a first inorganic package layer 411, an organic package layer 412, and a second inorganic package layer 413. The thin film package layer 41 has advantages of lightness, thinness, flexibility and the like while isolating the water vapor, thereby protecting the display panel from the water and oxygen. The first organic baffle wall 11 is used for defining a boundary of the organic package layer 412, which helps the thin film package layer 41 to better block the water and oxygen.

Referring to FIGS. 1 to 5, the display panel further includes a first organic forbidden area 12 disposed around the display area 10, and no organic layer is disposed in the first organic forbidden area 12. Such first organic forbidden area 12 plays a role of isolating the water vapor, thus preventing the water vapor on a side of the first organic forbidden area 12 facing away from the display area 10 from invading the display area 10 along the organic layer.

Exemplarily, as shown in FIGS. 1 to 5, the display panel further includes an organic planarization layer 34, a pixel defining layer 35, and an organic support pillar 36. The organic planarization layer 34 is located on the side of the first metal layer 31 facing towards the substrate 30. In a direction perpendicular to the substrate 30 is located, the pixel defining layer 35 is located on a side of the first metal layer 31 facing away from the substrate 30, the pixel defining layer 35 includes multiple opening structures in each of which a respective one of the multiple light emitting units 20 is located. The organic support pillar 36 is located on the side of the first metal layer 31 facing away from the substrate 30. The first organic baffle wall 11 can be prepared by selecting any one or more of the organic planarization layer 34, the pixel defining layer 35 and the organic support pillar 36. For example, as shown in FIGS. 2 and 5, the first organic baffle wall 11 includes a first organic baffle wall sub-segment 111, a second organic baffle wall sub-segment 112 and the organic support pillar 36. The first organic baffle wall sub-segment 111 is disposed in a same layer as the organic planarization layer 34, so that the first organic baffle wall sub-segment 111 can be prepared in a same process as the organic planarization layer 34. The second organic baffle wall sub-segment 112 is disposed in a same layer as the pixel defining layer 35, so that the second organic baffle wall sub-segment 112 can be prepared in a same process as the pixel defining layer 35. The organic planarization layer 34 and the pixel defining layer 35 are both organic layers, and the water vapor may invade into the display area 10 from the first organic baffle wall 11 along at least one of the organic planarization layer 34 or the pixel defining layer 35. Therefore, in the embodiment of the present disclosure, the first organic forbidden area 12 is disposed on the side of the first organic baffle wall 11 facing towards the display area 10, and is not provided with organic layers such as the organic planarization layer 34 and the pixel defining layer 35, thereby blocking a water vapor path at the first organic forbidden area 12, preventing the water vapor at the first organic baffle wall 11 from invading the display area 10 along the organic layer, and improving the reliability of the display panel.

It is to be noted that since the first inorganic package layer 411 is provided between the organic package layer 412 in the thin film package layer 41 and the organic layers such as the organic planarization layer 34 and the pixel defining layer 35 to isolate the water vapor, the first organic forbidden area 12 may be provided with the organic package layer 412. Moreover, the first organic forbidden area 12 may be disposed on the side of the first organic baffle wall 11 facing towards the display area 10, and the first organic forbidden area 12 may also be disposed on the side of the first organic baffle wall 11 facing away from the display area 10. In the embodiment of the present disclosure, only the first organic forbidden area 12 being located on the side of the first organic baffle wall 11 facing towards the display area 10 is taken as an example. In other embodiments, those skilled in the art may configure according to actual requirements.

Referring to FIGS. 1 to 5, to ensure that the display panel has a large screen-to-body ratio while reducing the loading of the first metal layer 31 and the second metal layer 32, an edge of a side of the first metal layer 31 facing away from the display area 10 is disposed at the first organic baffle wall 11 or on a side of the first organic baffle wall 11 facing away from the display area 10 to increase a contact area between the first metal layer 31 and the second metal layer 32, so that the influence of the resistance on the first power supply in the transmission process between the first metal layer 31 and the second metal layer 32 is reduced, thereby improving the uniformity of the current on the second electrode 202 and avoiding the occurrence of Mura. Therefore, the first metal layer 31 may cover at least part of the first organic forbidden area 12 and at least part of the first organic baffle wall 11.

If an edge cross section of the first metal layer 31 is exposed, the edge of the first metal layer 31 is easy to be oxidized and raised, thus forming a dark spot and influencing the display effect of the display panel. Therefore, as shown in FIGS. 1 to 5, the display panel provided by the embodiment of the present disclosure further includes an organic protective layer 33, which covers at least a side wall of the edge of the first metal layer 31, thereby preventing the edge cross section of the first metal layer 31 from being exposed, also thereby preventing the edge of the first metal layer 31 from being oxidized to form the dark spots, and improving the display effect of the display panel.

Referring to FIGS. 4 and 5, using an example in which the first organic forbidden area 12 is located on the side of the first organic baffle wall 11 facing towards the display area 10, since the first metal layer 31 extends to the first organic baffle wall 11, the first metal layer 31 covers part of the first organic forbidden area 12 and part of the first organic baffle wall 11. The organic protective layer 33 is communicated with the first organic barrier 11 and the organic layer on a side of the first organic forbidden area 12 facing towards the display area 10 along the edge of the first metal layer 31 separately. Therefore, the organic protective layer 33 forms a water vapor transmission path, and the water vapor may easily enter the organic layer on the side of the first organic forbidden area 12 facing towards the display area 10 from the first organic baffle wall 11 along the organic protective layer 33, and further invades the display area 10, thus affecting the package quality and reducing the service life and reliability of the display panel.

Referring to FIGS. 4 and 5, in the display panel provided by the embodiment of the present disclosure, the edge of the first metal layer 31 includes the first edge segment 311 overlapping the first organic forbidden area 12. A length of the first edge segment 311 is provided to be larger than a length of the first organic forbidden area 12 in a first direction X to prolong the water vapor transmission path formed by the organic protective layer 33, so that the water vapor cannot easily enter the display area 10 along the organic protective layer 33, thereby improving the package quality, and the service life and reliability of the display panel. The first direction X is a direction in which the display area 10 points to the first organic forbidden area 12.

Exemplarily, as shown in FIGS. 4 and 5, if the edge of the first metal layer 31 is provided to overlap the edge of the second metal layer 32, the length of the first edge segment 311 is the same as a length d2 of the first organic forbidden area 12 in the first direction X. In this case, the water vapor may easily enter the display area 10 from the first organic baffle wall 11 along the organic protective layer 33, thereby affecting the package quality. In this embodiment, the length d1 of the first edge segment 311 is provided to be larger than the length d2 of the first organic forbidden area 12 in the first direction X to prolong the water vapor transmission path formed by the organic protective layer 33, so that the water vapor cannot easily enter the display area 10 along the organic protective layer 33, thereby improving the package quality, and the service life and reliability of the display panel.

In the display panel provided by the embodiment of the present disclosure, the first metal layer 31 is provided to cover at least part of the first organic forbidden area 12 and at least part of the first organic baffle wall 11, so that the contact area between the first metal layer 31 and the second metal layer 32 is increased, and the influence of the resistance on the first power supply in the transmission process between the first metal layer 31 and the second metal layer 32 is reduced while ensuring a large screen-to-body ratio of the display panel, thereby improving the uniformity of the current on the second electrode 202, and avoiding the occurrence of Mura. The organic protective layer 33 is provided to cover at least the side wall of the edge of the first metal layer 31, thereby preventing the edge cross section of the first metal layer 31 from being exposed, thereby preventing the edge of the first metal layer 31 from being oxidized to form the dark spots, and improving the display effect of the display panel. In this embodiment, the length of the first edge segment 311 overlapping the first organic forbidden area 12 is provided to be larger than the length of the first organic forbidden area 12 in the first direction X to prolong the water vapor transmission path formed by the organic protective layer 33, so that the water vapor cannot easily enter the display area 10 along the organic protective layer 33, thereby improving the package quality, and the service life and reliability of the display panel.

Further referring to FIGS. 4 and 5, optionally; a vertical projection of the first edge segment 311 on the substrate 30 is a straight line, and an extension direction of the straight line intersects the first direction X.

As shown in FIG. 4, the extension direction of the first edge segment 311 is provided to intersect the first direction X. That is, the first edge segment 311 is disposed obliquely, so that the length of the first edge segment 311 is larger than the length d2 of the first organic forbidden area 12 in the first direction X, the length of the first edge segment 311 is prolonged, and then the water vapor transmission path formed by the organic protective layer 33 is prolonged. In this manner, the water vapor cannot easily enter the display area 10 along the organic protective layer 33, thereby improving the package quality, and the service life and reliability of the display panel.

Figure 6:
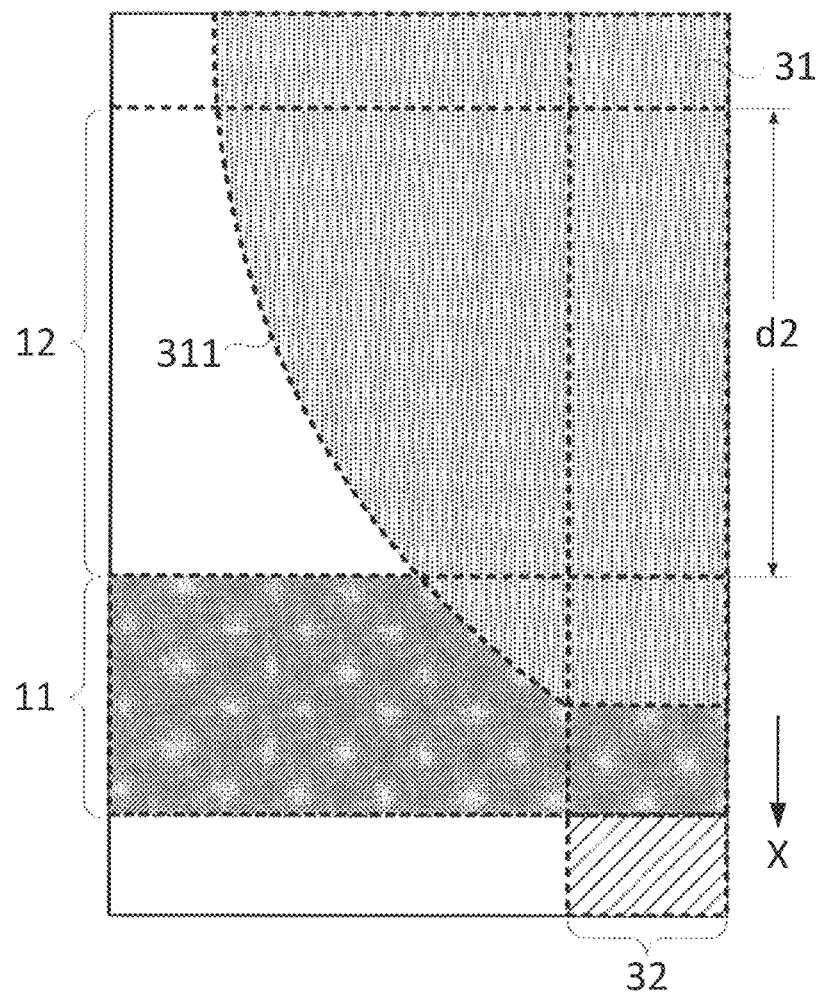
FIG. 6 is a partial structural view of a display panel provided by an embodiment of the present disclosure.
Figure 7:
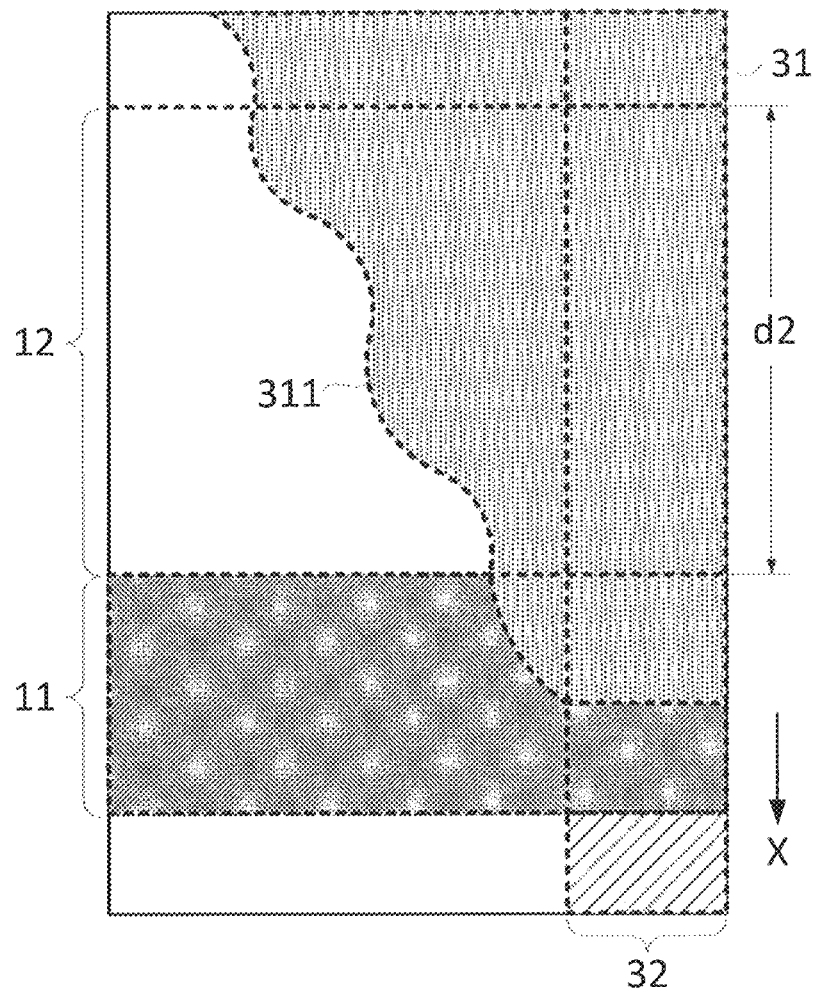
FIG. 7 is a partial structural view of another display panel provided by an embodiment of the present disclosure.

FIG. 6 is a partial structural view of a display panel provided by an embodiment of the present disclosure. FIG. 7 is a partial structural view of another display panel provided by an embodiment of the present disclosure. As shown in FIGS. 6 and 7, optionally, the vertical projection of the first edge segment 311 on the substrate 30 is a curve.

As shown in FIG. 6, the first edge segment 311 is provided to be a curve, so that the length of the first edge segment 311 is larger than the length d2 of the first organic forbidden area 12 in the first direction X, the length of the first edge segment 311 is prolonged, and then the water vapor transmission path formed by the organic protective layer 33 is prolonged. In this manner, the water vapor cannot easily enter the display area 10 along the organic protective layer 33, thereby improving the package quality, and the service life and reliability of the display panel.

It is to be noted that the first edge segment 311 may be configured as an arbitrary curve. For example, the first edge segment 311 is configured as an arc line as shown in FIG. 6, or the first edge segment 311 is configured as a wavy line as shown in FIG. 7, which may be configured by those skilled in the art according to actual requirements.

Figure 8:
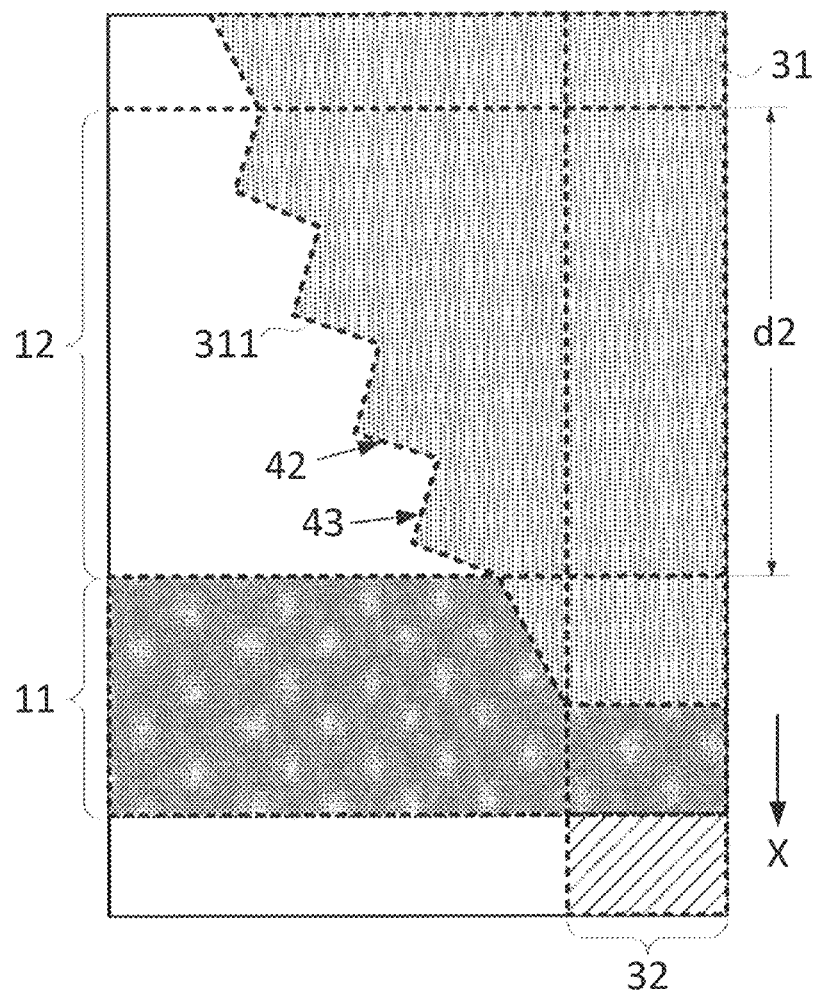
FIG. 8 is a partial structural view of another display panel provided by an embodiment of the present disclosure.
Figure 9:
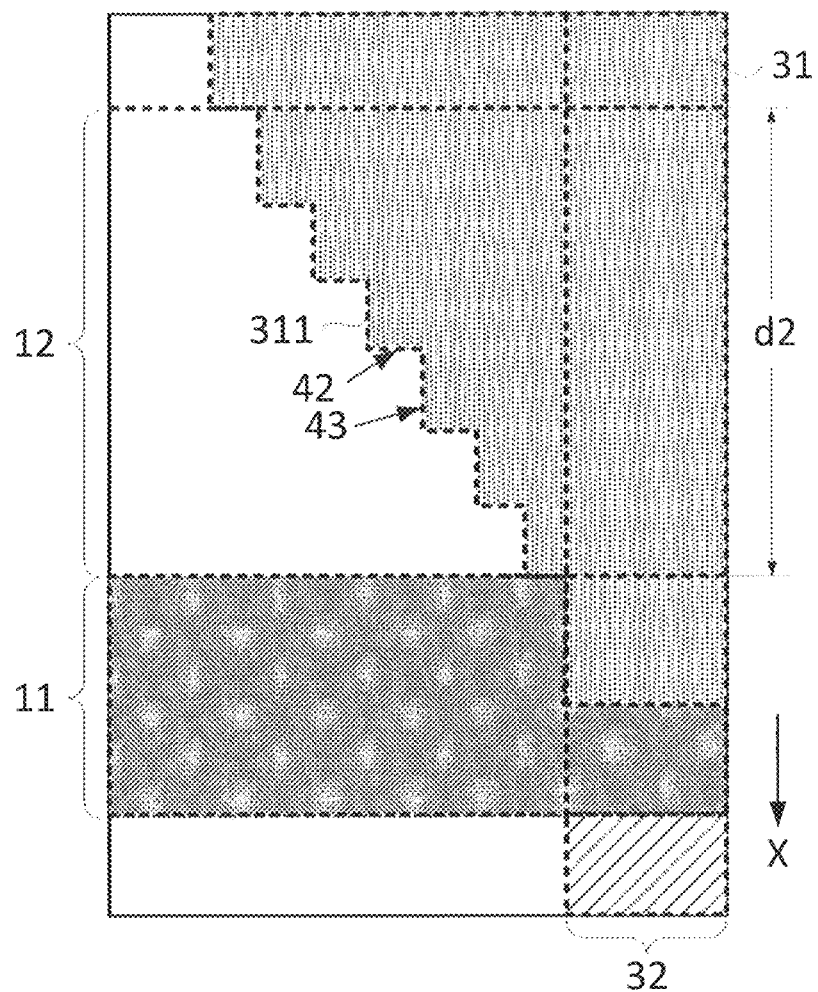
FIG. 9 is a partial structural view of a display panel provided by an embodiment of the present disclosure.
Figure 10:
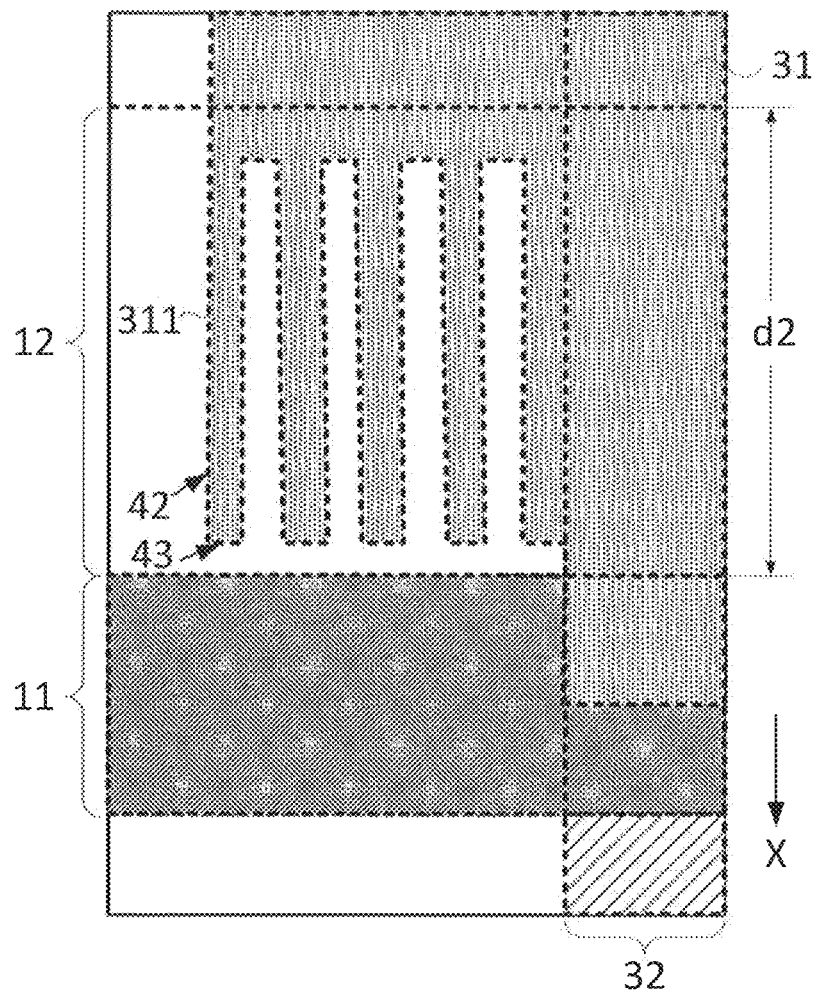
FIG. 10 is a partial structural view of another display panel provided by an embodiment of the present disclosure.

FIG. 8 is a partial structural view of another display panel provided by an embodiment of the present disclosure. FIG. 9 is a partial structural view of a display panel provided by an embodiment of the present disclosure. FIG. 10 is a partial structural view of another display panel provided by an embodiment of the present disclosure. As shown in FIGS. 8 to 10, optionally, the first edge segment 311 includes at least a first edge sub-segment 42 and a second edge sub-segment 43. The first edge sub-segment 42 is connected to the second edge sub-segment 43. In a direction parallel to the substrate 30, an extension direction of the first edge sub-segment 42 intersects an extension direction of the second edge sub-segment 43.

As shown in FIGS. 8 to 10, the extension direction of the first edge sub-segment 42 of the first edge segment 311 is provided to intersect the extension direction of the second edge sub-segment 43 of the first edge segment 311 so that the first edge sub-segment 42 and the second edge sub-segment 43 form a polyline, and then a length of the first edge segment 311 is larger than a length d2 of the first organic forbidden area 12 in a first direction X. Thus, the length of the first edge segment 311 is prolonged, and a water vapor transmission path formed by the organic protective layer 33 is prolonged, so that the water vapor cannot easily enter the display area 10 along the organic protective layer 33, thereby improving the package quality, and the service life and reliability of the display panel.

It is to be noted that the first edge segment 311 may be configured as an arbitrary polyline. For example, the first edge segment 311 is configured in a zigzag shape as shown in FIG. 8, or the first edge segment 311 is configured in a stepped shape as shown in FIG. 9, or the first edge segment 311 is configured in a pulse shape as shown in FIG. 10, which may be configured by those skilled in the art according to actual requirements.

Figure 11:
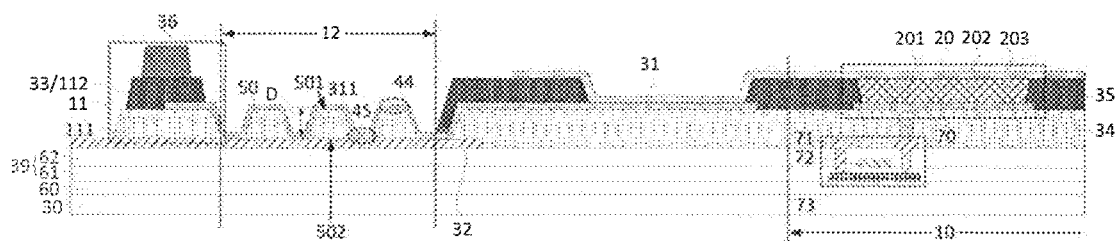
FIG. 11 is a partial sectional view of a display panel provided by an embodiment of the present disclosure.

FIG. 11 is a partial sectional view of a display panel provided by an embodiment of the present disclosure. As shown in FIG. 11, optionally, the first edge segment 311 includes a third edge sub-segment 44 and a fourth edge sub-segment 45, and a distance between the third edge sub-segment 44 and the fourth edge sub-segment 45 is D in a direction perpendicular to the substrate 30, where D>0.

As shown in FIG. 11, the distance D between the third edge sub-segment 44 of the first edge segment 311 and the fourth edge sub-segment 45 of the first edge segment 311 is provided to be greater than 0, that is, the first edge segment 311 is undulating, so that the length of the first edge segment 311 is prolonged in a direction perpendicular to the substrate 30, and a water vapor transmission path formed by the organic protective layer 33 is then prolonged. In this manner, the water vapor cannot easily enter the display area 10 along the organic protective layer 33, thereby improving the package quality, and the service life and reliability of the display panel.

Further referring to FIG. 11, optionally, the first organic forbidden area 12 includes at least one organic island 50. The at least one organic island 50 is located on a side of the first metal layer 31 facing towards the substrate 30 facing towards the substrate 30, and the at least one organic island 50 is spaced from the first organic baffle wall 11. The at least one organic island 50 overlaps the third edge sub-segment 44 in a direction perpendicular to the substrate 30.

Specifically, as shown in FIG. 11, the at least one organic island 50 is disposed in the first organic forbidden area 12, the at least one organic island 50 is located on the side of the first metal layer 31 facing towards the substrate 30, and the at least one organic island 50 overlaps the third edge sub-segment 44 in the direction perpendicular to the substrate 30, so that a height difference between the third edge sub-segment 44 and the fourth edge sub-segment 45 is formed, the distance D between the third edge sub-segment 44 and the fourth edge sub-segment 45 is achieved to be greater than 0. In this manner, the length of the first edge segment 311 in the direction perpendicular to the substrate 30 is prolonged, and then the water vapor transmission path formed by the organic protective layer 33 is prolonged, so that the water vapor cannot easily enter the display area 10 along the organic protective layer 33, thereby improving the package quality, and the service life and reliability of the display panel.

The at least one organic island 50 needs to be spaced from the first organic baffle wall 11, thus preventing the at least one organic island 50 from being communicated with the first organic baffle wall 11 to form the water vapor transmission path.

It is to be noted that the number of the organic islands 50 and the size of the organic island 50 can be set according to actual requirements, which is not limited by the embodiment of the present disclosure.

Further referring to FIG. 11, optionally, the display panel provided by the embodiment of the present disclosure further includes an organic planarization layer 34 located on a side of the first metal layer 31 facing towards the substrate 30, and the at least one organic island 50 is disposed in a same layer as the organic planarization layer 34.

Specifically, as shown in FIG. 11, the planarization layer 34 is disposed on the side of the first metal layer 31 facing towards the substrate 30. The at least one organic island 50 is disposed in the same layer as the organic planarization layer 34 so that the at least one organic island 50 and the organic planarization layer 34 can be prepared in a same process, thereby shortening the preparation time of the display panel and reducing the cost.

Figure 12:
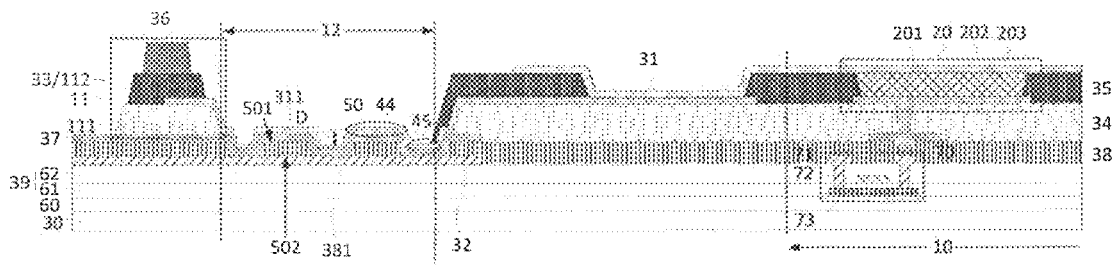
FIG. 12 is a partial sectional view of another display panel provided by an embodiment of the present disclosure.

FIG. 12 is a partial sectional view of another display panel provided by an embodiment of the present disclosure. As shown in FIG. 12, optionally, the display panel provided by the embodiment of the present disclosure further includes a third metal layer 37 and a first organic layer 38. The third metal layer 37 is located on a side of the second metal layer 32 facing towards the first metal layer 31, the first organic layer 38 is located between the second metal layer 32 and the third metal layer 37, and the at least one organic island 50 is disposed in a same layer as the first organic layer 38.

Specifically, as shown in FIG. 12, the display panel further includes the third metal layer 37. The third metal layer 37 is located on the side of the second metal layer 32 facing towards the first metal layer 31. The third metal layer 37 may be connected to the second metal layer 32 to form a double-layer trace, so that the trace resistance is reduced to achieve the effect of reducing the voltage drop, thereby reducing the display nonuniformity:

The first organic layer 38 is disposed between the second metal layer 32 and the third metal layer 37, thereby reducing a coupling capacitance between the second metal layer 32 and the third metal layer 37, which facilitates improving the display effect of the display panel.

The at least one organic island 50 is disposed in the same layer as the first organic layer 38 so that the at least one organic island 50 and the first organic layer 38 can be prepared in a same process, thereby shortening the preparation time of the display panel and reducing the cost.

It is to be noted that the second metal layer 32 and the third metal layer 37 may be further provided with another insulating layer in addition to the first organic layer 38, such as an inorganic layer insulating layer, which may be provided by those skilled in the art according to actual requirements.

Figure 13:
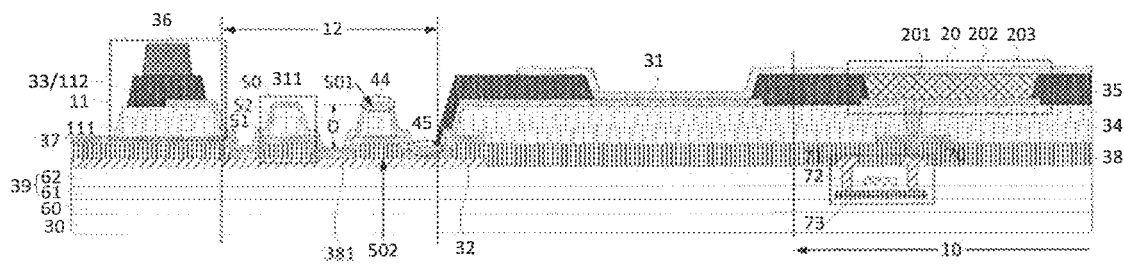
FIG. 13 is a partial sectional view of another display panel provided by an embodiment of the present disclosure.

FIG. 13 is a partial sectional view of another display panel provided by an embodiment of the present disclosure. As shown in FIG. 13, optionally, each organic island 50 includes a first organic sub-segment 51 and a second organic sub-segment 52. The second organic sub-segment 52 is located on a side of the first organic sub-segment 51 facing away from the substrate 30. The display panel further includes a third metal layer 37 and a first organic layer 38. The third metal layer 37 is located on a side of the second metal layer 32 facing towards the first metal layer 31, the first organic layer 38 is located between the second metal layer 32 and the third metal layer 37, and the first organic sub-segment 51 is disposed in a same layer as the first organic layer 38. The display panel further includes an organic planarization layer 34. The organic planarization layer 34 is located on a side of the first metal layer 31 facing towards the substrate 30, and the second organic sub-segment 52 is disposed in a same layer as the organic planarization layer 34.

Specifically, as shown in FIG. 13, each organic island 50 includes the first organic sub-segment 51 and the second organic sub-segment 52. The first organic sub-segment 51 is disposed in a same layer as the first organic layer 38 so that the first organic sub-segment 51 and the first organic layer 38 can be prepared in a same process, thereby shortening the preparation time of the display panel and reducing the cost. The second organic sub-segment 52 is disposed in a same layer as the organic planarization layer 34 so that the second organic sub-segment 52 and the organic planarization layer 34 can be prepared in a same process, thereby shortening the preparation time of the display panel and reducing the cost.

Each organic island 50 is provided to include the first organic sub-segment 51 and the second organic sub-segment 52 so that a distance D between the third edge sub-segment 44 and the fourth edge sub-segment 45 is increased, and then a length of the first edge segment 311 is further increased. In this manner, the water vapor transmission path formed by the organic protective layer 33 is prolonged, so that the water vapor cannot easily enter the display area 10 along the organic protective layer 33, thereby improving the package quality, and the service life and reliability of the display panel.

Further referring to FIGS. 12 and 13, optionally, the first metal layer 31 is connected to the third metal layer 37. The first organic layer 38 includes a first through hole 381, and the third metal layer 37 is connected to the second metal layer 32 through the first through hole 381.

As shown in FIGS. 12 and 13, the second metal layer 32 provides a first power supply to the second electrode 202 through the third metal layer 37 and the first metal layer 31. Compared with the case where the second metal layer 32 is directly electrically connected to the second electrode 202, in this embodiment, drilling a deeper through hole to make the second metal layer 32 be directly connected to the second electrode 202 can be avoided, so that the problem of poor contact between the second metal layer 32 and the second electrode 202 caused by drilling the deeper through hole can be solved, which facilitates improving the reliability of the display panel.

Further referring to FIGS. 11 to 13, optionally, each organic island 50 includes a first surface 501 and a second surface 502. The first surface 501 is located on a side of the organic island 50 facing away from the substrate 30, and the second surface 502 is located on a side of the organic island 50 facing towards the substrate 30. A vertical projection of the first surface 501 on the substrate 30 is within a vertical projection of the second surface 502 on the substrate 30.

As shown in FIGS. 11 to 13, in the direction perpendicular to the substrate 30, the projection of the first surface 501 on the side of the organic island 50 facing away from the substrate 30 is located within the projection of the second surface 502 on the side of the organic island 50 facing towards the substrate 30, so that a sidewall of the organic island 50 is inclined, thereby preventing the first metal layer 31 above the organic island 50 from being fractured.

Figure 14:
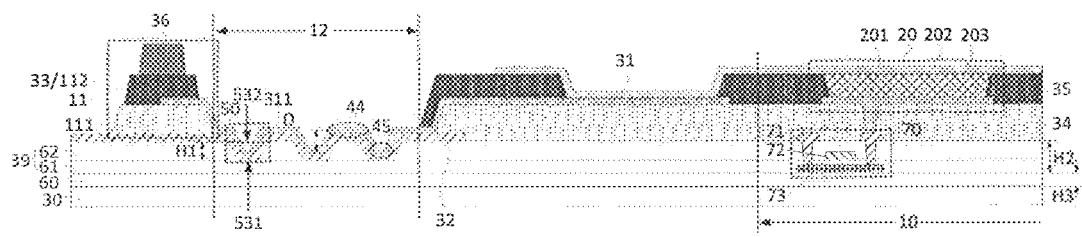
FIG. 14 is a partial sectional view of another display panel provided by an embodiment of the present disclosure.

FIG. 14 is a partial sectional view of another display panel provided by an embodiment of the present disclosure. As shown in FIG. 14, optionally, the display panel provided by the embodiment of the present disclosure further includes an inorganic layer 39. The inorganic layer 39 is located on a side of the substrate 30 facing towards the first metal layer 31, and the inorganic layer 39 includes at least one groove 53. The at least one groove 53 is located in the first organic forbidden area 12, and a vertical projection of each groove 53 on the substrate 30 overlaps a vertical projection of the respective fourth edge sub-segment 45 on the substrate 30.

As shown in FIG. 14, the at least one groove 53 is disposed in the inorganic layer 39 in the first organic forbidden area 12 and the vertical projection of each groove 53 on the substrate 30 overlaps the vertical projection of the respective fourth edge sub-segment 45 on the substrate 30, so that a height difference is formed between the fourth edge sub-segment 45 and the third edge sub-segment 44, a distance D between the third edge sub-segment 44 and the fourth edge sub-segment 45 is greater than ( ) In this manner, a length of the first edge segment 311 is prolonged in a direction perpendicular to the substrate 30, and a water vapor transmission path formed by the organic protective layer 33 is further prolonged, so that the water vapor cannot easily enter the display area 10 along the organic protective layer 33, thereby improving the package quality, and the service life and reliability of the display panel.

Further referring to FIG. 14, optionally, the display panel provided by the embodiment of the present disclosure further includes a buffer layer 60. The buffer layer 60 is located on a side of the substrate 30 facing towards the inorganic layer 39. A depth of each groove 53 is H1, a thickness of the inorganic layer 39 is H2, and a thickness of the buffer layer 60 is H3, where 0<H1<H2+H3.

The buffer layer 60 is disposed on the side of the substrate 30 facing towards the inorganic layer 39 to play a role of shakeproof, buffer, and isolation. The depth H1 of each groove 53 is provided to be greater than 0 so that the height difference is formed between the third edge sub-segment 44 and the fourth edge sub-segment 45, achieving that the distance D between the third edge sub-segment 44 and the fourth edge sub-segment 45 is greater than 0. In this manner, the length of the first edge segment 311 is prolonged in the direction perpendicular to the substrate 30, and the water vapor transmission path formed by the organic protective layer 33 is further prolonged, so that the water vapor cannot easily enter the display area 10 along the organic protective layer 33, thereby improving the package quality, and the service life and reliability of the display panel. The depth H1 of each groove 53 is provided to be smaller than a sum of the thickness H2 of the inorganic layer 39 and the thickness H3 of the buffer layer 60 so that the formation of a through hole is avoided in the buffer layer 60, thereby preventing the buffer layer 60 from losing the role of isolation.

It is to be noted that each groove 53 can penetrate any one or more inorganic layers 39, which may be set by those skilled in the art according to actual requirements.

Exemplarily, as shown in FIG. 14, the inorganic layer 39 includes a gate insulating layer 61 and an interlayer insulating layer 62. The at least one groove 53 only penetrates the interlayer insulating layer 62. In other embodiments, the at least one groove 53 may be provided to be deeper, that is, the depth H1 of the at least one groove 53 is greater to increase the distance D between the third edge sub-segment 44 and the fourth edge sub-segment 45, so that the length of the first edge segment 311 is further increased, and the water vapor transmission path formed by the organic protective layer 33 is prolonged. In this manner, the water vapor cannot easily enter the display area 10 along the organic protective layer 33, thereby improving the package quality, and the service life and reliability of the display panel, which is not limited by the embodiment of the present disclosure.

Further referring to FIG. 14, optionally, each groove 53 includes a bottom 531 and a top 532. The bottom 531 is located on a side of the groove 53 facing towards the substrate 30, and the top 532 is located on a side of the groove 53 facing away from the substrate 30. A vertical projection of the bottom 531 on the substrate 30 is within a vertical projection of the top 532 on the substrate 30.

As shown in FIG. 14, in the direction perpendicular to the substrate 30, a projection of the bottom 531 of each groove 53 is located within a projection of the top 532 of the each groove 53, so that a sidewall of each 53 is inclined, thereby preventing the first metal layer 31 above the at least one groove 53 from being fractured.

Further referring to FIGS. 1 to 5, optionally; the first organic forbidden area 12 is located on the side of the first organic baffle wall 11 facing towards the display area 10. The edge of the first metal layer 31 further includes a second edge segment 312. The second edge segment 312 is located on a side of the first edge segment 311 facing away from the display area 10, and the second edge segment 312 is connected to the first edge segment 311. The vertical projection of the second edge segment 312 on the substrate 30 is within the vertical projection of the first organic baffle wall 11 on the substrate 30.

As shown in FIGS. 1 to 5, the first organic forbidden area 12 is located on the side of the first organic baffle wall 11 facing towards the display area 10, thereby preventing the water vapor at the first organic baffle wall 11 from invading the display area 10 along the organic layer, and improving the reliability of the display panel.

The vertical projection of the second edge segment 312 on the substrate 30 is provided to be within the vertical projection of the first organic baffle wall 11 on the substrate 30 so that the first organic baffle wall 11 covers a side wall of the second edge segment 312 to prevent the edge cross section of the second edge segment 312 from being exposed, thereby preventing the second edge segment 312 from being oxidized to form the dark spots, and improving the display effect of the display panel.

Figure 15:
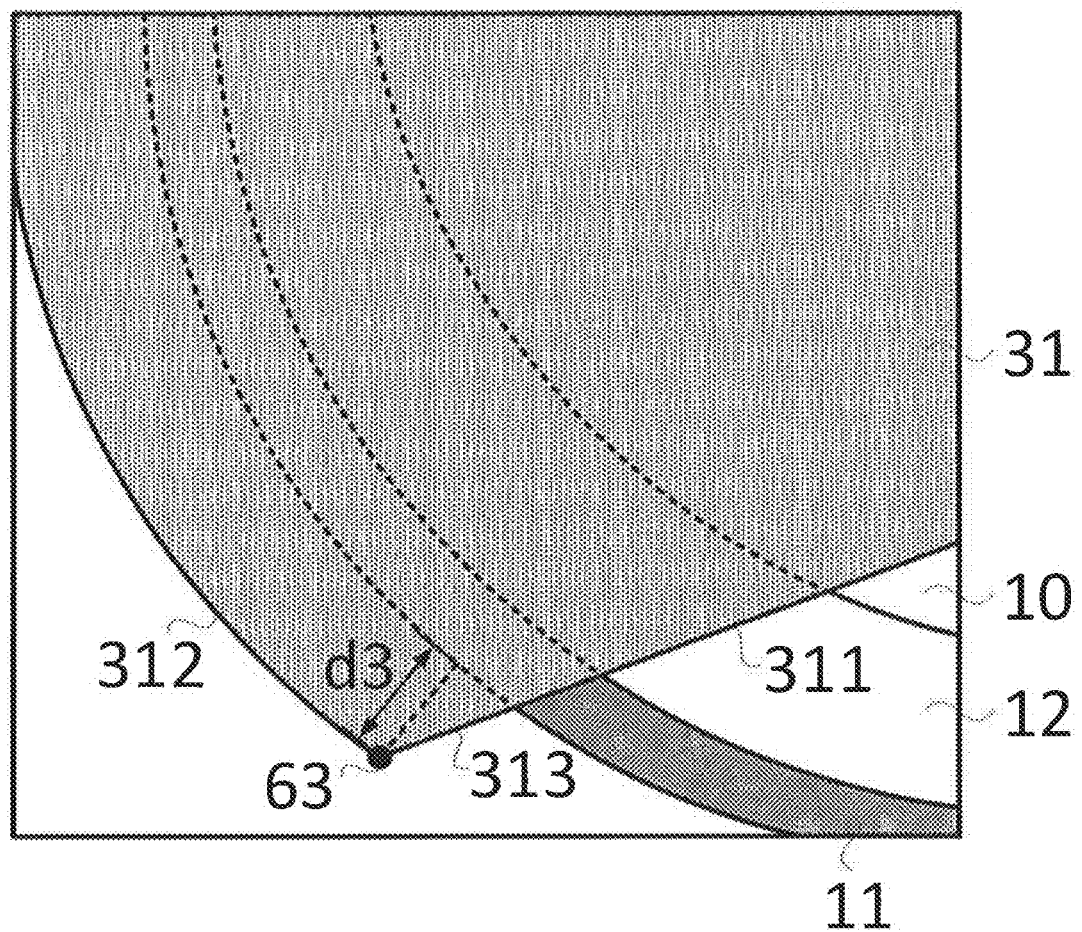
FIG. 15 is a partial structural view of another display panel provided by an embodiment of the present disclosure.

FIG. 15 is a partial structural view of another display panel provided by an embodiment of the present disclosure. As shown in FIG. 15, optionally, a first organic forbidden area 12 is located on a side of the first organic baffle wall 11 facing towards the display area 10. An edge of the first metal layer 31 further includes a second edge segment 312. The second edge segment 312 is located on a side of the first organic baffle wall 11 facing away from the display area 10, and the second edge segment 312 is spaced from the first organic baffle wall 11. The edge of the first metal layer 31 further includes a third edge segment 313. The third edge segment 313 is connected to the second edge segment 312 and the first organic baffle wall 11 separately: A length of the third edge segment 313 is greater than a shortest distance d3 between a first intersection point 63 and the first organic forbidden area 12. The first intersection point 63 is an intersection point of the second edge segment 312 and the third edge segment 313.

As shown in FIG. 15, the first organic forbidden area 12 is disposed on the side of the first organic baffle wall 11 facing towards the display area 10, thereby preventing the water vapor at the first organic baffle wall 11 from invading the display area 10 along the organic layer, and improving the reliability of the display panel.

The second edge segment 312 is provided to be located on the side of the first organic baffle wall 11 facing away from the display area 10, and the second edge segment 312 is spaced from the first organic baffle wall 11, so that the contact area between the first metal layer 31 and the second metal layer 32 is further increased while ensuring a large screen-to-body ratio of the display panel, and the influence of the resistance on the first power supply in the transmission process between the first metal layer 31 and the second metal layer 32 is reduced, thereby improving the uniformity of the current on the second electrode 202, and avoiding the occurrence of Mura.

As shown in FIG. 15, the water vapor may be transmitted from the second edge segment 312 to the first organic baffle wall 11 along the third edge segment 313, and then invade the display area 10 along the first edge segment 311, affecting the package quality. Therefore, in the display panel provided by the embodiment of the present disclosure, the length of the third edge segment 313 is provided to be greater than the shortest distance d3 between the first intersection point 63 and the first organic forbidden area 12 to prolong the water vapor transmission path formed by the third edge segment 313, so that the water vapor cannot easily enter the display area 10 along the third edge segment 313, thereby improving the package quality, and the service life and reliability of the display panel.

Figure 16:
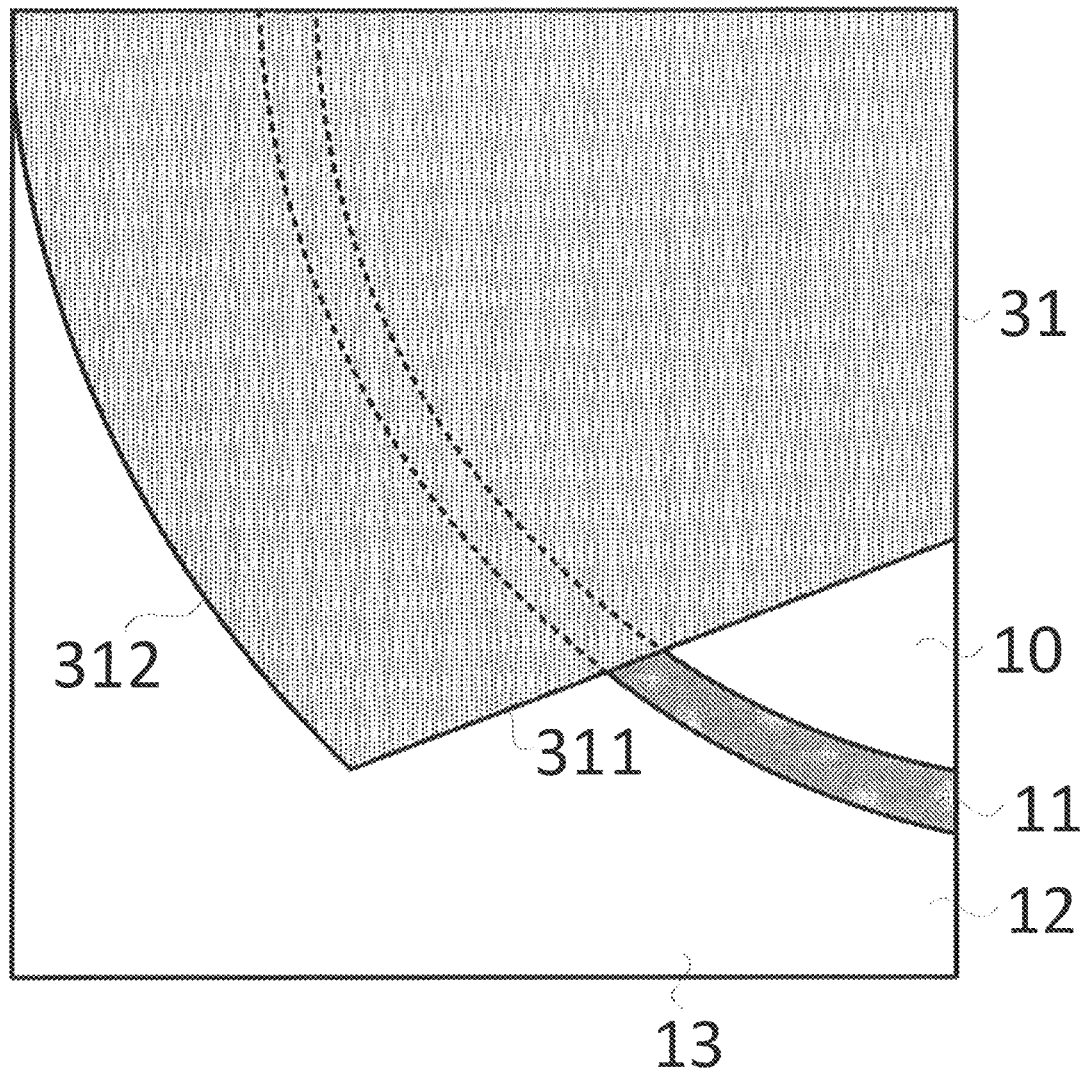
FIG. 16 is a partial structural view of another display panel provided by an embodiment of the present disclosure.

FIG. 16 is a partial structural view of another display panel provided by an embodiment of the present disclosure.

As shown in FIG. 16, optionally, a first organic forbidden area 12 is located on a side of the first organic baffle wall 11 facing away from the display area 10. The display panel also includes a second organic baffle wall 13 surrounding the first organic forbidden area 12. An edge of the first metal layer 31 further includes a second edge segment 312, and a vertical projection of the second edge segment 312 on the substrate 30 overlaps a vertical projection of the second organic baffle wall 13 on the substrate 30.

As shown in FIG. 16, the first organic forbidden area 12 is located on the side of the first organic baffle wall 11 facing away from the display area 10, thereby preventing the external water vapor from invading the first organic baffle wall 11, and improving the reliability of the display panel.

Further referring to FIG. 16, the display panel further includes the second organic baffle wall 13 surrounding the first organic forbidden area 12. The second organic baffle wall 13 can play a role of blocking the crack propagation. The second organic baffle wall 13 may have a structure same as or different from the structure of the first organic baffle wall 11, which is not limited by the embodiment of the present disclosure. The vertical projection of the second edge segment 312 on the substrate 30 overlaps the vertical projection of the second organic baffle wall 13 on the substrate 30, so that the second organic baffle wall 13 covers a side wall of the second edge segment 312 to prevent the edge cross section of the second edge segment 312 from being exposed, thereby preventing the second edge segment 312 from being oxidized to form the dark spots, and improving the display effect of the display panel.

Figure 17:
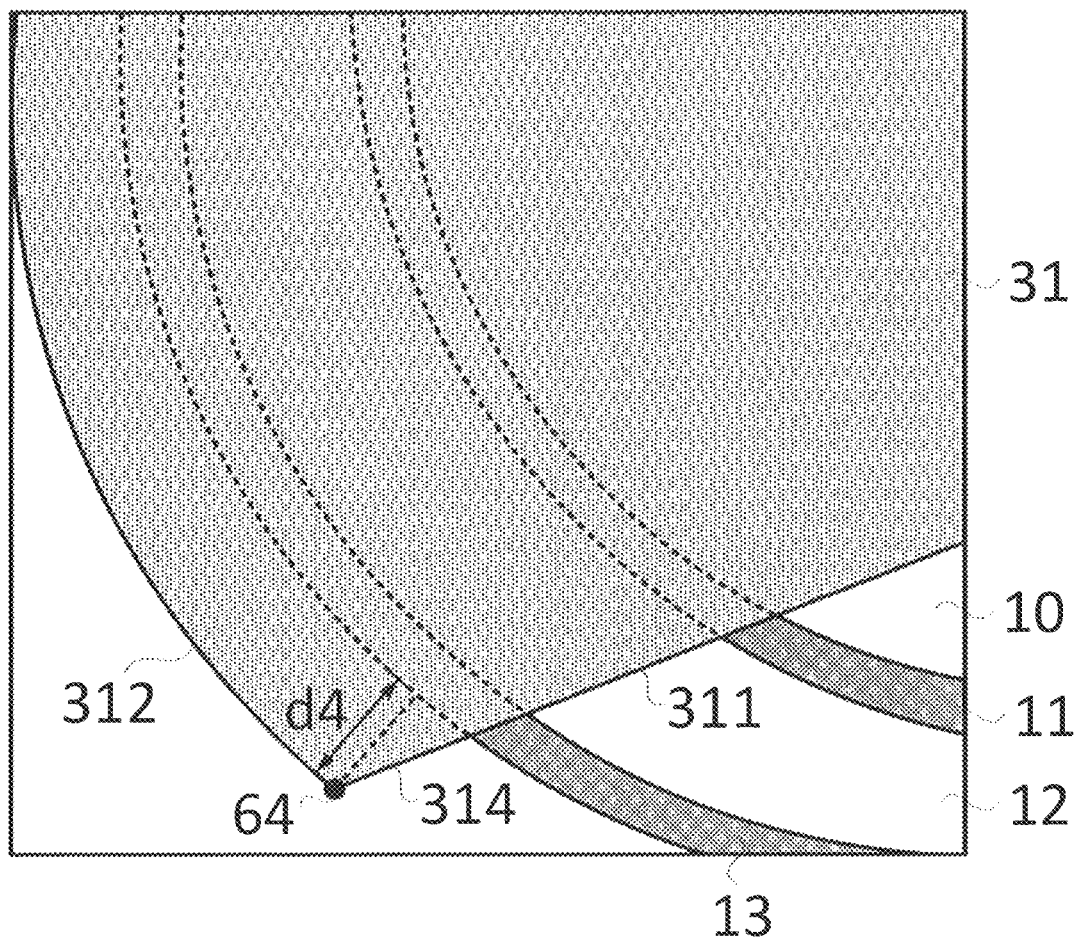
FIG. 17 is a partial structural view of another display panel provided by an embodiment of the present disclosure.

FIG. 17 is a partial structural view of another display panel provided by an embodiment of the present disclosure. As shown in FIG. 17, optionally, a first organic forbidden area 12 is located on a side of the first organic baffle wall 11 facing away from the display area 10. The display panel also includes a second organic baffle wall 13 surrounding the first organic forbidden area 12. An edge of the first metal layer 31 further includes a second edge segment 312. The second edge segment 312 is located on a side of the second organic baffle wall 13 facing away from the display area 10, and is spaced apart from the second organic baffle wall 13. The edge of the first metal layer 31 further includes a fourth edge segment 314. The fourth edge segment 314 is connected to the second edge segment 312 and the second organic baffle wall 13 separately: A length of the fourth edge segment 314 is greater than a shortest distance d4 between a second intersection point 64 and the second organic baffle wall 13. The second intersection point 64 is an intersection point of the fourth edge segment 314 and the second edge segment 312.

As shown in FIG. 17, the first organic forbidden area 12 is located on the side of the first organic baffle wall 11 facing away from the display area 10, thereby preventing the external water vapor from invading the first organic baffle wall 11, and improving the reliability of the display panel.

Further referring to FIG. 17, the display panel further includes the second organic baffle wall 13 surrounding the first organic forbidden area 12. The second organic baffle wall 13 can play a role of blocking the crack propagation. The second edge segment 312 is provided to be located on the side of the second organic baffle wall 13 facing away from the display area 10, and the second edge segment 312 is spaced from the second organic baffle wall 13, so that the contact area between the first metal layer 31 and the second metal layer 32 is further increased while ensuring a large screen-to-body ratio of the display panel. The influence of the resistance on the first power supply in the transmission process between the first metal layer 31 and the second metal layer 32 thus is reduced, thereby improving the uniformity of the current on the second electrode 202, and avoiding the occurrence of Mura.

As shown in FIG. 17, the water vapor may be transmitted from the second edge segment 312 to the second organic baffle wall 13 along the fourth edge segment 314, and then invade the display area 10 along the first edge segment 311, affecting the package quality. Therefore, in the display panel provided by the embodiment of the present disclosure, the length of the fourth edge segment 314 is provided to be greater than the shortest distance d4 between the second intersection point 64 and the second organic baffle wall 13 to prolong the water vapor transmission path formed by the fourth edge segment 314, so that the water vapor cannot easily enter the display area 10 along the fourth edge segment 314, thereby improving the package quality, and the service life and reliability of the display panel.

Figure 18:
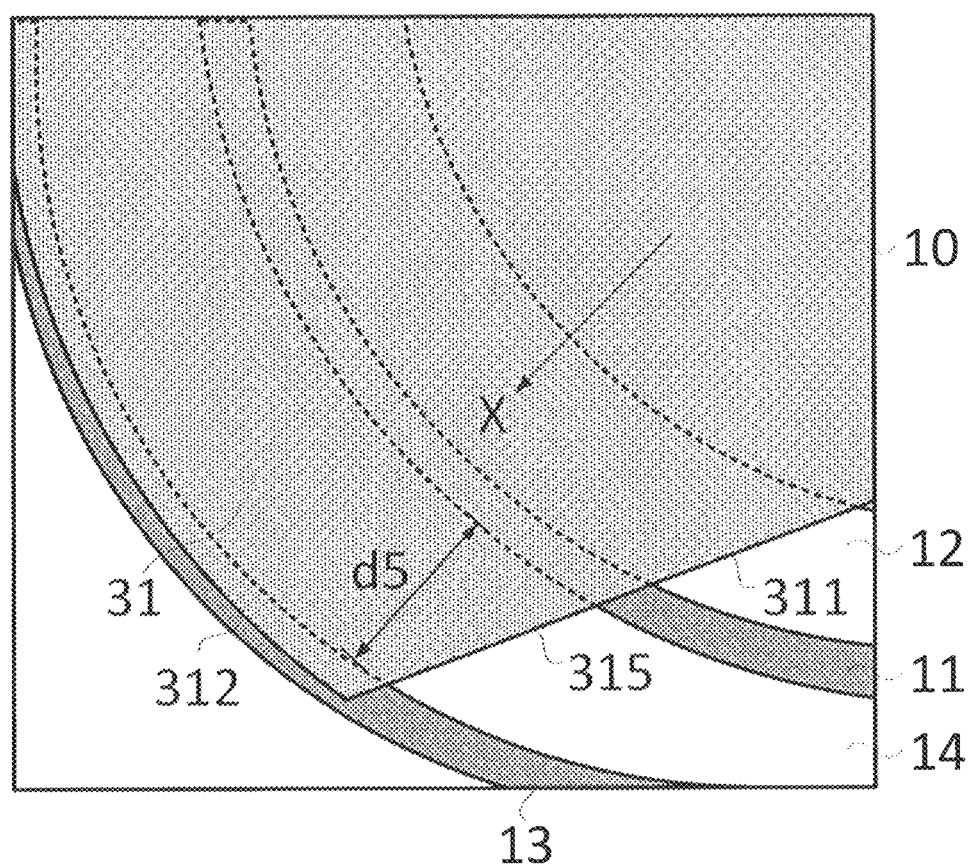
FIG. 18 is a partial structural view of another display panel provided by an embodiment of the present disclosure.

FIG. 18 is a partial structural view of another display panel provided by an embodiment of the present disclosure. As shown in FIG. 18, optionally, a first organic forbidden area 12 is located on a side of the first organic baffle wall 11 facing towards the display area 10. The display panel also includes a second organic forbidden area 14 surrounding the first organic baffle wall 11 and a second organic baffle wall 13 surrounding the second organic forbidden area 14. An edge of the first metal layer 31 further includes a second edge segment 312, and a vertical projection of the second edge segment 312 on the substrate 30 overlaps a vertical projection of the second organic baffle wall 13 on the substrate 30. The edge of the first metal layer 31 further includes a fifth edge segment 315. The fifth edge segment 315 is connected to the second edge segment 312 and the first organic baffle wall 11 separately. A length of the fifth edge segment 315 is greater than a length of the second organic forbidden area 14 in a first direction X.

As shown in FIG. 18, the first organic forbidden area 12 is located on the side of the first organic baffle wall 11 facing towards the display area 10, thereby preventing the water vapor at the first organic baffle wall 11 from invading the display area 10 along the organic layer, and improving the reliability of the display panel.

Further referring to FIG. 18, the display panel further includes the second organic baffle wall 13 surrounding the second organic forbidden area 14. The second organic baffle wall 13 can play a role of blocking the crack propagation. The display panel further includes the second organic forbidden area 14 surrounding the first organic baffle wall 11, thereby preventing the water vapor at the second organic baffle wall 13 from invading the display area 10 along the organic layer, and improving the reliability of the display panel.

Further referring to FIG. 18, the vertical projection of the second edge segment 312 on the substrate 30 is provided to overlap the vertical projection of the second organic baffle wall 13 on the substrate 30, so that the second organic baffle wall 13 covers the side wall of the second edge segment 312 to prevent the edge cross section of the second edge segment 312 from being exposed, thereby preventing the second edge segment 312 from being oxidized to form the dark spots, and improving the display effect of the display panel.

Further referring to FIG. 18, the water vapor may be transmitted from the second edge segment 312 to the second organic baffle wall 13 along the fifth edge segment 315, and then invade the display area 10 along the first edge segment 311, affecting the package quality. Therefore, in the display panel provided by the embodiment of the present disclosure, the length of the fifth edge segment 315 is provided to be greater than a length d5 of the second organic forbidden area 14 in the first direction X to prolong a water vapor transmission path formed by the fifth edge segment 315, so that the water vapor cannot easily enter the display area 10 along the fifth edge segment 315, thereby improving the package quality, and the service life and reliability of the display panel.

Figure 19:
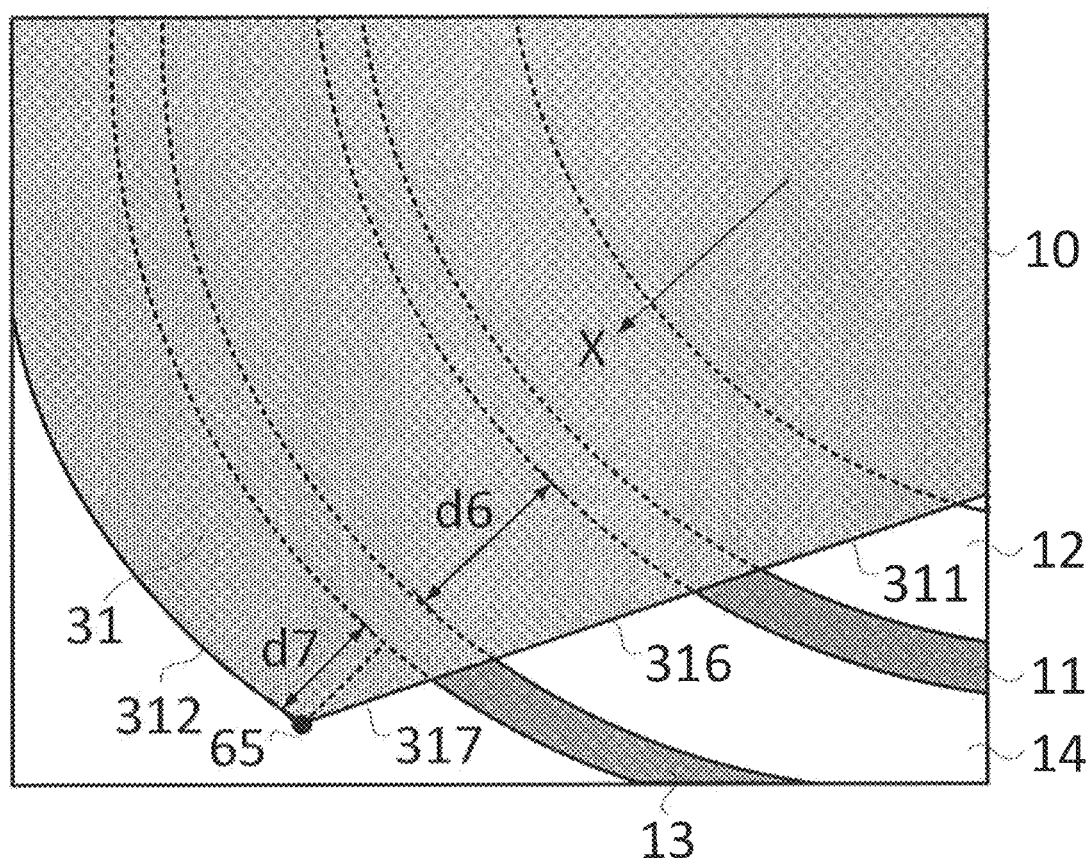
FIG. 19 is a partial structural view of another display panel provided by an embodiment of the present disclosure.

FIG. 19 is a partial structural view of another display panel provided by an embodiment of the present disclosure. As shown in FIG. 19, optionally, a first organic forbidden area 12 is located on a side of the first organic baffle wall 11 facing towards the display area 10. The display panel also includes a second organic forbidden area 14 surrounding the first organic baffle wall 11 and a second organic baffle wall 13 surrounding the second organic forbidden area 14. An edge of the first metal layer 31 further includes a second edge segment 312, the second edge segment 312 is located on a side of the second organic baffle wall 13 facing away from the display area 10, and is spaced apart from the second organic baffle wall 13. The edge of the first metal layer 31 further includes a sixth edge segment 316, and a vertical projection of the sixth edge segment 316 on the substrate 30 overlaps the second organic forbidden area 14. A length of the sixth edge segment 316 is greater than a length of the second organic forbidden area 14 in the first direction X. The edge of the first metal layer 31 further includes a seventh edge segment 317. The seventh edge segment 317 is connected to the second edge segment 312 and the second organic baffle wall 13 separately. A length of the seventh edge segment 317 is greater than a shortest distance between a third intersection point 65 and the second organic baffle wall 13. The third intersection point 65 is an intersection point of the seventh edge segment 317 and the second edge segment 312.

As shown in FIG. 19, the first organic forbidden area 12 is located on the side of the first organic baffle wall 11 facing towards the display area 10, thereby preventing the water vapor at the first organic baffle wall 11 from invading the display area 10 along the organic layer, and improving the reliability of the display panel.

Further referring to FIG. 19, the display panel further includes the second organic baffle wall 13 surrounding the second organic forbidden area 14. The second organic baffle wall 13 can play a role of blocking the crack propagation. The display panel further includes the second organic forbidden area 14 surrounding the first organic baffle wall 11, thereby preventing the water vapor at the second organic baffle wall 13 from invading the display area 10 along the organic layer, and improving the reliability of the display panel. The second edge segment 312 is provided to be located on the side of the second organic baffle wall 13 facing away from the display area 10, and the second edge segment 312 is spaced from the second organic baffle wall 13, so that the contact area between the first metal layer 31 and the second metal layer 32 is further increased while ensuring a large screen-to-body ratio of the display panel, and the influence of the resistance on the first power supply in the transmission process between the first metal layer 31 and the second metal layer 32 is reduced, thereby improving the uniformity of the current on the second electrode 202, and avoiding the occurrence of Mura.

Further referring to FIG. 19, the water vapor may be transmitted from the second organic baffle wall 13 to the first organic baffle wall 11 along the sixth edge segment 316, and then invade the display area 10 along the first edge segment 311, affecting the package quality. Therefore, in the display panel provided by the embodiment of the present disclosure, the length of the fifth edge segment 316 is provided to be greater than a length d6 of the second organic forbidden area 14 in the first direction X to prolong a water vapor transmission path formed by the sixth edge segment 316, so that the water vapor cannot easily enter the display area 10 along the sixth edge segment 316, thereby improving the package quality, and the service life and reliability of the display panel.

Moreover, the water vapor may be transmitted from the second edge segment 312 to the second organic baffle wall 13 along the seventh edge segment 317, and then invade the display area 10 along the sixth edge segment 316 and the first edge segment 311, affecting the package quality: Therefore, in the display panel provided by the embodiment of the present disclosure, the length of the seventh edge segment 317 is provided to be greater than the shortest distance d7 between the third intersection point 65 and the second organic baffle wall 13 to prolong a water vapor transmission path formed by the seventh edge segment 317, so that the water vapor cannot easily enter the display area 10 along the seventh edge segment 317, thereby improving the package quality; and the service life and reliability of the display panel.

Further referring to FIGS. 1 to 5, optionally, the display panel provided by the embodiment of the present disclosure further includes a pixel defining layer 35. The pixel defining layer 35 includes multiple opening structures in each of which a respective one of multiple light emitting units 20 is located. In a direction perpendicular to the substrate 30, the pixel defining layer 35 is located on a side of the first metal layer 31 facing away from the substrate 30. The organic protective layer 33 is disposed in a same layer as the pixel defining layer 35.

As shown in FIGS. 1 to 5, the organic protective layer 33 is configured to be disposed in the same layer as the pixel defining layer 35, so that the organic protective layer 33 and the pixel defining layer 35 can be prepared in a same process, thereby shortening the preparation time of the display panel and reducing the cost.

Figure 20:
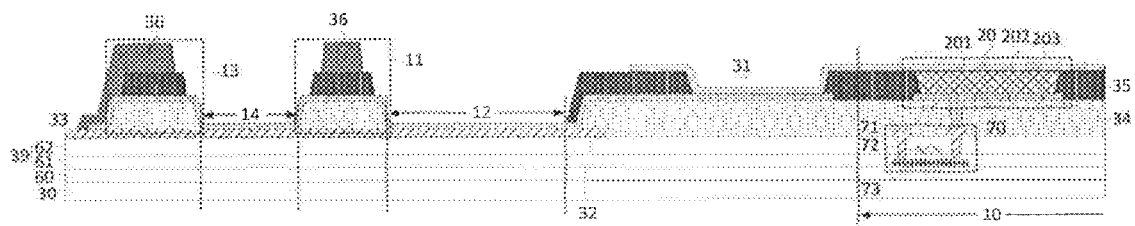
FIG. 20 is a partial sectional view of another display panel provided by an embodiment of the present disclosure.

FIG. 20 is a partial sectional view of another display panel provided by an embodiment of the present disclosure. As shown in FIG. 20, optionally, the display panel provided by the embodiment of the present disclosure further includes an organic support pillar 36. The organic support pillar 36 is located at a side of the first metal layer 31 facing away from the substrate 30. The organic protective layer 33 is disposed in a same layer as the organic support pillar 36.

As shown in FIG. 20, the organic support pillar 36 is disposed at the side of the first metal layer 31 facing away from the substrate 30. The organic support pillar 36 is used for supporting a cover plate. The organic protective layer 33 is disposed in the same layer as the organic support pillar 36 so that the organic protective layer 33 and the organic support pillar 36 can be prepared in a same process, thereby shortening the preparation time of the display panel and reducing the cost.

Further referring to FIG. 2, the display panel provided in the embodiment of the present disclosure further includes multiple drive units. The multiple drive units are located on a side of the substrate 30 facing towards the multiple light emitting units 20, and the multiple drive units are correspondingly connected to the multiple light emitting units 20. Each drive unit includes a thin film transistor 70. The thin film transistor 70 includes a source-drain metal layer 71, and the second metal layer 32 is disposed in a same layer as the source-drain metal layer 71.

Specifically; as shown in FIG. 2, each drive unit includes at least one thin film transistor 70. Each thin film transistor 70 includes the source-drain metal layer 71, a gate layer 72 and an active layer 73. The source-drain metal layer 71 has a relatively small resistance. The second metal layer 32 is disposed in the same layer as the source-drain metal layer 71 so that the second metal layer 32 and the source-drain metal layer 71 can be prepared in a same process, which shortens the preparation time of the display panel and facilitates reducing the resistance of the second metal layer 32, thereby improving the uniformity of the current on the second metal layer 32 and avoiding the occurrence of Mura.

Figure 21:
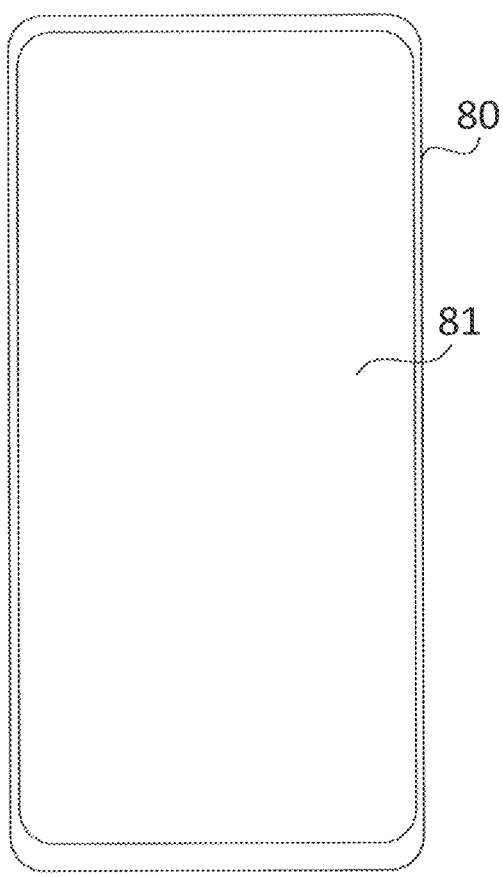
FIG. 21 is a structural diagram of a display device provided by an embodiment of the present disclosure.

Based on the same concept, an embodiment of the present disclosure also provides a display device. FIG. 21 is a structural view of a display device provided by an embodiment of the present disclosure. As shown in FIG. 21, the display device 80 includes the display panel 81 according to any one of the above embodiments of the present disclosure. Therefore, the display device 80 provided by the embodiment of the present disclosure has the technical effects of the technical solution of any one of the embodiments described above, and a description of structures and terms which are same as or correspond to those in the embodiments described above are not be repeated here. The display device 80 provided by the embodiments of the present disclosure may be a phone shown in FIG. 21, or may be any electronic product with a display function, including but not limited to the following categories: television, laptop, desktop display, tablet computer, digital camera, smart bracelet, smart glass, vehicle-mounted display, medical equipment, industrial control equipment, touch interactive terminal, and the like, and no special limitations are made thereto in the embodiments of the present disclosure.

It is to be noted that the above are only example embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
a display area, wherein the display area comprises a plurality of light emitting units arranged in an array, and each of the plurality of light emitting units comprises a first electrode and a second electrode;
a first organic-layer forbidden area and a first organic baffle wall which are disposed around the display area;
a substrate;
a drive chip;
a first metal layer and a second metal layer which are located at a side of the substrate, wherein the first metal layer is disposed in a same layer as the first electrode, the first metal layer is located at a side of the second metal layer facing away from the substrate, the second electrode is connected to the first metal layer, the first metal layer is connected to the second metal layer, the second metal layer is configured to provide a first power supply for the second electrode through the first metal layer, and the first metal layer covers at least part of the first organic-layer forbidden area and at least part of the first organic baffle wall; and
an organic protective layer, wherein the organic protective layer covers at least a side wall of an edge of the first metal layer, and the organic protective layer is connected to the first organic baffle wall, wherein the edge of the first metal layer comprises a first edge segment and the first metal layer is terminated at the first edge segment, the first edge segment overlaps the first organic-layer forbidden area in a direction perpendicular to the substrate; and wherein a length of the first edge segment is larger than a length of the first organic-layer forbidden area in a first direction;
wherein at least part of the first organic-layer forbidden area and at least part of the first organic baffle wall are disposed along the first direction, and the first direction is a direction in which the display area points to the drive chip in a plane direction parallel to the substrate;
wherein the first edge segment comprises a third edge sub-segment and a fourth edge sub-segment;
in a direction perpendicular to the substrate, a distance between the third edge sub-segment and the fourth edge sub-segment is D, wherein D>0;
the first organic-layer forbidden area comprises at least one organic island, the at least one organic island is located on a side of the first metal layer, wherein the side of the first metal layer faces towards the substrate, and the at least one organic island is spaced from the first organic baffle wall; and
the at least one organic island overlaps the third edge sub-segment in a direction perpendicular to the substrate;
wherein each of the at least one organic island comprises a first organic sub-segment and a second organic sub-segment, wherein the second organic sub-segment is located on a side of the first organic sub-segment facing away from the substrate;
the display panel further comprises a third metal layer and a first organic layer, wherein the third metal layer is located on a side of the second metal layer facing towards the first metal layer, and the first organic layer is located between the second metal layer and the third metal layer; and the first organic sub-segment is disposed in a same layer as the first organic layer;
the display panel further comprises an organic planarization layer, wherein the organic planarization layer is located on the side of the first metal layer facing towards the substrate, and the second organic sub-segment is disposed in a same layer as the organic planarization layer; and
the first metal layer is connected to the third metal layer, the first organic layer comprises a first through hole, and the third metal layer is connected to the second metal layer through the first through hole.

2. The display panel of claim 1, wherein a vertical projection of the first edge segment on the substrate is a straight line, and an extension direction of the straight line intersects the first direction.

3. The display panel of claim 1, wherein a vertical projection of the first edge segment on the substrate is a curve.

4. The display panel of claim 1, wherein
the first edge segment comprises at least a first edge sub-segment and a second edge sub-segment, wherein the first edge sub-segment is connected to the second edge sub-segment; and in a direction parallel to the substrate, an extension direction of the first edge sub-segment intersects an extension direction of the second edge sub-segment.

5. The display panel of claim 1, wherein each of the at least one organic island comprises a first surface and a second surface, the first surface is located on a side of the each of the at least one organic island facing away from the substrate, and the second surface is located on a side of the each of the at least one organic island facing towards the substrate; and a vertical projection of the first surface on the substrate is within a vertical projection of the second surface on the substrate.

6. The display panel of claim 1, further comprising: an inorganic layer, wherein the inorganic layer is located on a side of the substrate facing towards the first metal layer; the inorganic layer comprises at least one groove; the at least one groove is located in the first organic-layer forbidden area; and a vertical projection of the at least one groove on the substrate overlaps a vertical projection of the fourth edge sub-segment on the substrate; and a buffer layer, wherein the buffer layer is located on a side of the substrate facing towards the inorganic layer; and wherein a depth of each of the at least one groove is H1, a thickness of the inorganic layer is H2, and a thickness of the buffer layer is H3, wherein 0<H1<H2+H3, wherein each of the at least one groove comprises a bottom and a top, the bottom is located on a side of the each of the at least one groove facing towards the substrate, and the top is located on a side of the each of the at least one groove facing away from the substrate; and a vertical projection of the bottom on the substrate is within a vertical projection of the top on the substrate.

7. The display panel of claim 1, further comprising a pixel defining layer, wherein the pixel defining layer comprises a plurality of opening structures in each of which a respective one of the plurality of light emitting units is located;
in a direction perpendicular to the substrate, the pixel defining layer is located on a side of the first metal layer facing away from the substrate; and
the organic protective layer is disposed in a same layer as the pixel defining layer.

8. The display panel of claim 1, further comprising an organic support pillar located at a side of the first metal layer facing away from the substrate, wherein the organic support pillar is disposed in a same layer as the organic protective layer.

9. The display panel of claim 1, further comprising a plurality of drive units located on a side of the substrate facing towards the plurality of light emitting units, wherein
the plurality of drive units are correspondingly connected to the plurality of light emitting units; and
each of the plurality of drive units comprises a thin film transistor, the thin film transistor comprises a source-drain metal layer, and the second metal layer is disposed in a same layer as the source-drain metal layer.

10. A display device, comprising a display panel, wherein the display panel comprises:
a display area, wherein the display area comprises a plurality of light emitting units arranged in an array, and each of the plurality of light emitting units comprises a first electrode and a second electrode;
a first organic-layer forbidden area and a first organic baffle wall which are disposed around the display area;
a substrate;
a drive chip;
a first metal layer and a second metal layer which are located at a side of the substrate, wherein the first metal layer is disposed in a same layer as the first electrode, the first metal layer is located at a side of the second metal layer facing away from the substrate, the second electrode is connected to the first metal layer, the first metal layer is connected to the second metal layer, the second metal layer is configured to provide a first power supply for the second electrode through the first metal layer, and the first metal layer covers at least part of the first organic-layer forbidden area and at least part of the first organic baffle wall; and
an organic protective layer, wherein the organic protective layer covers at least a side wall of an edge of the first metal layer, and the organic protective layer is connected to the first organic baffle wall, wherein the edge of the first metal layer comprises a first edge segment and the first metal layer is terminated at the first edge segment, the first edge segment overlaps the first organic-layer forbidden area in a direction perpendicular to the substrate; and wherein a length of the first edge segment is larger than a length of the first organic-layer forbidden area in a first direction;
wherein at least part of the first organic-layer forbidden area and at least part of the first organic baffle wall are disposed along the first direction, and the first direction is a direction in which the display area points to the drive chip in a plane direction parallel to the substrate;
wherein the first edge segment comprises a third edge sub-segment and a fourth edge sub-segment;
in a direction perpendicular to the substrate, a distance between the third edge sub-segment and the fourth edge sub-segment is D, wherein D>0);
the first organic-layer forbidden area comprises at least one organic island, the at least one organic island is located on a side of the first metal layer, wherein the side of the first metal layer faces towards the substrate, and the at least one organic island is spaced from the first organic baffle wall; and
the at least one organic island overlaps the third edge sub-segment in a direction perpendicular to the substrate;
wherein each of the at least one organic island comprises a first organic sub-segment and a second organic sub-segment, wherein the second organic sub-segment is located on a side of the first organic sub-segment facing away from the substrate;
the display panel further comprises a third metal layer and a first organic layer, wherein the third metal layer is located on a side of the second metal layer facing towards the first metal layer, and the first organic layer is located between the second metal layer and the third metal layer; and the first organic sub-segment is disposed in a same layer as the first organic layer;
the display panel further comprises an organic planarization layer, wherein the organic planarization layer is located on the si of the first metal layer facing towards the substrate, and the second organic sub-segment is disposed in s same layer as the organic planarization layer; and
the first metal layer is connected to the third metal layer, the first organic layer comprises a first through hole, and the third metal layer is connected to the second metal layer through the first through hole.

* * * * *